United States Patent
Huang et al.

(10) Patent No.: US 9,362,331 B2
(45) Date of Patent: Jun. 7, 2016

(54) METHOD AND SYSTEM FOR IMAGE SENSOR AND LENS ON A SILICON BACK PLANE WAFER

(71) Applicants: Semiconductor Manufacturing International (Shanghai) Corporation, Shanghai (CN); Semiconductor Manufacturing International (Beijing) Corporation, Beijing (CN)

(72) Inventors: Herb He Huang, Jiangsu (CN); Mieno Fumitake, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 14/242,841

(22) Filed: Apr. 1, 2014

(65) Prior Publication Data

US 2014/0213012 A1    Jul. 31, 2014

Related U.S. Application Data

(62) Division of application No. 11/952,901, filed on Dec. 7, 2007, now Pat. No. 8,749,006.

(30) Foreign Application Priority Data

Dec. 8, 2006 (CN) .......................... 2006 1 0119388

(51) Int. Cl.
*H01L 31/18* (2006.01)
*H01L 31/0232* (2014.01)
*H01L 27/146* (2006.01)

(52) U.S. Cl.
CPC .... *H01L 27/14685* (2013.01); *H01L 27/14621* (2013.01); *H01L 27/14623* (2013.01); *H01L 27/14627* (2013.01); *H01L 27/14632* (2013.01); *H01L 27/14687* (2013.01)

(58) Field of Classification Search
USPC .................. 257/294, 431, 432, 435, E31.122, 257/E31.127
See application file for complete search history.

(56) References Cited

U.S. PATENT DOCUMENTS 6,246,081 B1   6/2001  Abe
6,312,969 B1  11/2001  Abe
(Continued)

OTHER PUBLICATIONS

Restriction Requirement for U.S. Appl. No. 11/952,901 mailed Mar. 24, 2010, 5 pages.
(Continued)

*Primary Examiner* — Lynne Gurley
*Assistant Examiner* — Vernon P Webb
(74) *Attorney, Agent, or Firm* — Kilpatrick Townsend and Stockton LLP

(57) ABSTRACT

A method for forming image sensors includes providing a substrate and forming a plurality of photo diode regions, each of the photo diode regions being spatially disposed on the substrate. The method also includes forming an interlayer dielectric layer overlying the plurality of photo diode regions, forming a shielding layer formed overlying the interlayer dielectric layer, and applying a silicon dioxide bearing material overlying the shielding layer. The method further includes etching portions of the silicon dioxide bearing material to form a plurality of first lens structures, and continuing to form each of the plurality of first lens structures to provide a plurality of finished lens structures.

19 Claims, 7 Drawing Sheets

(56) References Cited

U.S. PATENT DOCUMENTS

| | | |
|---|---|---|
| 7,294,818 B2 | 11/2007 | Matsuda et al. |
| 8,749,006 B2 | 6/2014 | Huang et al. |
| 2006/0049476 A1* | 3/2006 | Koizumi et al. ............ 257/432 |
| 2006/0081898 A1 | 4/2006 | Wang et al. |
| 2006/0145222 A1 | 7/2006 | Lee |
| 2007/0210395 A1 | 9/2007 | Maruyama et al. |
| 2008/0000872 A1 | 1/2008 | Amemiya |
| 2008/0087921 A1* | 4/2008 | Yu et al. .................... 257/213 |

OTHER PUBLICATIONS

Restriction Requirement for U.S. Appl. No. 11/952,901 mailed Mar. 24, 2010, 2 pages.

Non-Final Office Action for U.S. Appl. No. 11/952,901 mailed May 12, 2010, 10 pages.

Final Office Action for U.S. Appl. No. 11/952,901 mailed Aug. 26, 2010, 11 pages.

Advisory Action for U.S. Appl. No. 11/952,901 mailed Oct. 29, 2010, 3 pages.

Non-Final Office Action for U.S. Appl. No. 11/952,901 mailed Dec. 22, 2010, 12 pages.

Final Office Action for U.S. Appl. No. 11/952,901 mailed May 12, 2011, 13 pages.

Advisory Action for U.S. Appl. No. 11/952,901 mailed Jul. 29, 2011, 3 pages.

Non-Final Office Action for U.S. Appl. No. 11/952,901 mailed Oct. 4, 2011, 13 pages.

Final Office Action for U.S. Appl. No. 11/952,901 mailed Mar. 19, 2012, 16 pages.

Advisory Action for U.S. Appl. No. 11/952,901 mailed Jun. 8, 2012, 3 pages.

Notice of Allowance for U.S. Appl. No. 11/952,901 mailed Dec. 17, 2013, 9 pages.

Notice of Allowance for U.S. Appl. No. 11/952,901 mailed May 12, 2014, 4 pages.

\* cited by examiner

METHOD AND SYSTEM FOR IMAGE SENSOR AND LENS ON A SILICON BACK PLANE WAFER

CROSS-REFERENCES TO RELATED APPLICATIONS

This application is a divisional application of U.S. patent application Ser. No. 11/952,901, filed on Dec. 7, 2007, which claims priority to Chinese Application No. 200610119388.2, filed on Dec. 8, 2006; commonly assigned, both of which are hereby incorporated by reference for all purposes.

BACKGROUND OF THE INVENTION

The present invention is directed to integrated circuits and their processing for the manufacture of electronic devices. More particularly, the invention provides a method for manufacturing an integrated lens structure for an image sensing device. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is formation of device structures for imaging sensors such as charged coupled device (CCD), charge injected devices (CID), and others. Such imaging sensors (e.g., CCD, CID) include adaptive arrays of stacked color filters provided on micro lenses, which are incorporated into a silicon backplane. The silicon backplane includes MOS transistors and photo diode devices on the silicon wafers using different materials and processes due to process incompatibility. Such processes rely upon different tools and materials. Micro lenses are often stacked onto color filters, which are assembled using complex and cumbersome techniques. Accordingly, these sensors are often complex and difficult to manufacture. These and other limitations have been described in the present specification and more particularly below.

From the above, it is seen that an improved technique for processing devices is desired.

BRIEF SUMMARY OF THE INVENTION

According to the present invention, techniques directed to integrated circuits and their processing for the manufacture of electronic devices are provided. More particularly, the invention provides a method for manufacturing an integrated lens structure for an image sensing device. But it would be recognized that the invention has a much broader range of applicability.

In a specific embodiment, the present invention provides an improved image sensor, e.g., CCD, CID, CMOS. The image sensor includes a substrate, e.g., silicon wafer. The sensor also includes a plurality of photo diode regions, where each of the photo diode regions is spatially disposed on the substrate. The sensor has an interlayer dielectric layer overlying the plurality of photo diode regions and a shielding layer formed overlying the interlayer dielectric layer. A silicon dioxide bearing material is overlying the shielding layer. A plurality of lens structures are formed on the silicon dioxide bearing material. The sensor also has a color filter layer overlying the lens structures and a plurality of second lens structures overlying the color filter layer according to a preferred embodiment.

In an alternative specific embodiment, the present invention provides a method for forming image sensors, e.g., CCD, CID, CMOS. The method includes providing a substrate, e.g., silicon wafer. The method includes forming a plurality of photo diode regions, where each of the photo diode regions is spatially disposed on the substrate. The method includes forming an interlayer dielectric layer (e.g., borophosphosilicate glass (BPSG), doped oxide, phosphosilicate glass (PSG), fluorinated silicate glass (FSG)) overlying the plurality of photo diode regions. The method includes forming a shielding layer (e.g., metal) formed overlying the interlayer dielectric layer and applying a silicon dioxide bearing material overlying the shielding layer. The method includes etching portions of the silicon dioxide bearing material to form a plurality of first lens structures and continuing to form each of the plurality of first lens structures to provide a plurality of finished lens structures.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved mirror and lens structure, which are integrated with each other, for LCOS devices used for displays. Such integrated structure can provide improved yields and process capabilities according to a specific embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of electronic devices are provided. More particularly, the invention provides a method for manufacturing an integrated lens structure for an image sensing device. But it would be recognized that the invention has a much broader range of applicability.

Figure 1:
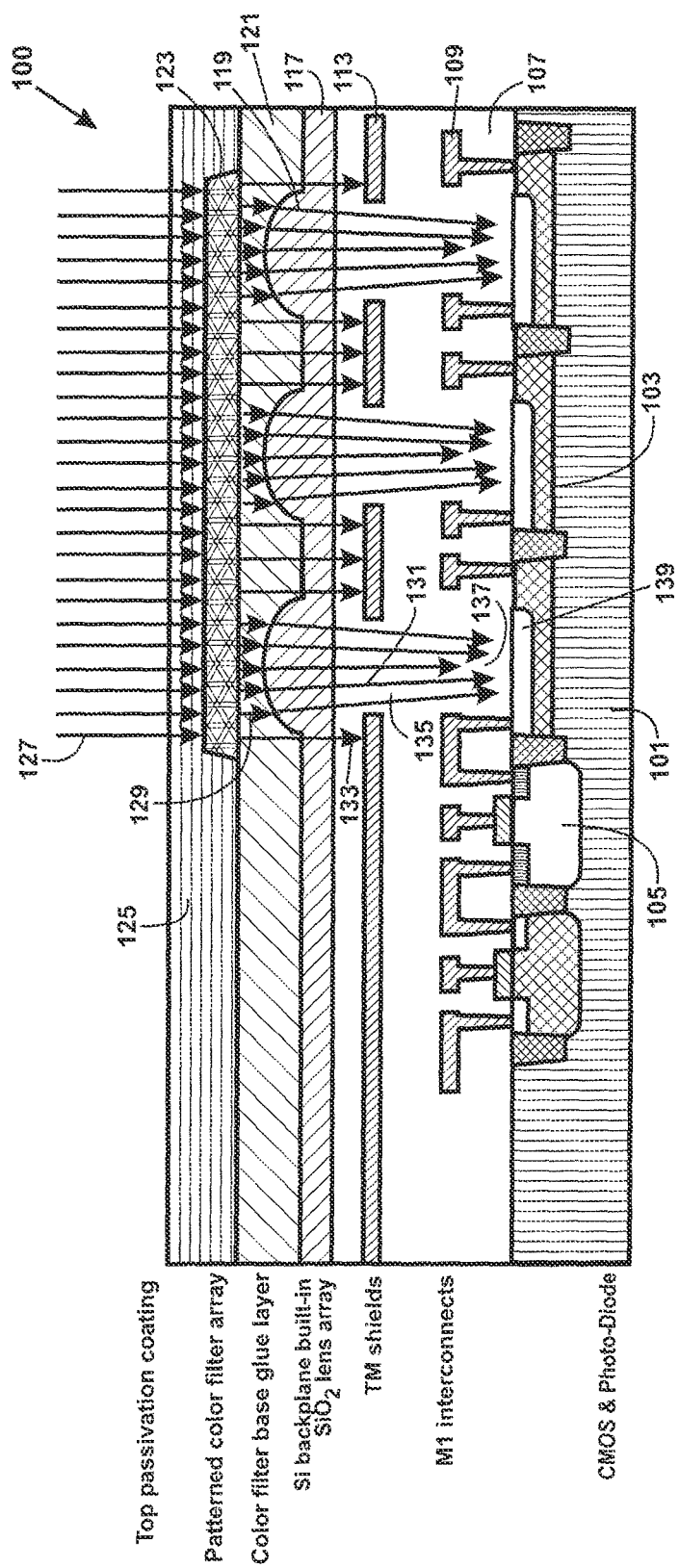
FIG. 1 is a simplified cross-sectional view diagram illustrating a sensing device according to an embodiment of the present invention.

FIG. 1 is a simplified cross-sectional view diagram illustrating a sensing device 100 according to an embodiment of the present invention. This diagram is merely an example, which should not unduly limit the scope of the claims herein. One of ordinary skill in the art would recognize many variations, modifications, and alternatives. As shown, the present invention provides an improved image sensor 100, e.g., CCD, CID, CMOS. The image sensor includes a substrate 101, e.g., silicon wafer. The sensor also includes a plurality of photo diode regions 103, where each of the photo diode regions is spatially disposed on the substrate. Each of the photo diode regions is also separated by an insulating layer or isolation region, as shown. A plurality of MOS and/or CMOS devices 105 are also included. Such devices can be made using standard foundry compatible processes, and the like.

The sensor has an interlayer dielectric layer 107 overlying the plurality of photo diode regions. The interlayer dielectric can be a single layer or multiple layers depending upon the specific embodiment. The layer can be made of a borophososilicate glass, phosophosilicate glass, fluorinated silicate glass, doped glass, or the like. Preferably, the interlayer dielectric layer has been planarized using chemical mechanical planarization and/or resist etch back techniques, among others. Of course, one of ordinary skill in the art would recognize many variations, modifications, and alternatives.

Referring to FIG. 1, the sensor also has a shielding layer 113 formed overlying the interlayer dielectric layer. The shielding layer can be a metal layer and/or other material that can block a selected portion of electromagnetic radiation, e.g., light. The shielding layer includes a plurality of openings, which allow light to traverse therethrough. Preferably, the shielding layer is made of a metal material, but can be made of any other single or combination of materials.

A silicon dioxide bearing material 117 is overlying the shielding layer as shown. A plurality of lens structures 119 are formed on the silicon dioxide bearing material. Other types of suitable materials can also be used for the lens structures. That is, any combination of layers or materials can be used with suitable lens characteristics. Each of the lens structures is annular and/or spherical in shape, depending upon the embodiment. Specific details on ways of fabricating the plurality of lens structures can be found throughout the present specification and more particularly below.

A planarizing layer 121 or glue layer is formed overlying the plurality of lens structures. The planarizing layer is preferably made of an organic type material such as polyimide and the like. The planarizing layer serves as a "glue" layer between the silicon lens structures and overlying color filter layer 123. The color filter layer has been patterned into an array structure depending upon the embodiment. Preferably, the color filter array includes colors such as red (R), green (G), and blue (B), depending upon the embodiment. As shown, the sensor also has the color filter layer overlying the lens structures. Overlying the color filter array is a passivation coating. The passivation coating can include any suitable materials such as a polymeric material. Other materials may also be used depending upon the application. Of course, one of ordinary skill in the art would recognize many variations, modifications, and alternatives.

In operation, light 127 falls onto the surfaces of a passivation layer 125. The light traverses through color filter array 123, where selected colors pass through selected spatial regions to illuminate a color from the RGB (red, green, and blue) pixel arrays. The light traverses 129 through the glue layer and through 131 each of the lens structures. Each of the lens structures focuses the light 135, which falls 137 onto photo diode 139, to cause a change in electrical characteristic of the photo diode. The change can be sensed using sensing circuitry, which is coupled to logic circuitry. As also shown, the shielding layer blocks 133 certain portions of light that are not focused onto the photo diode according to a preferred embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 2:
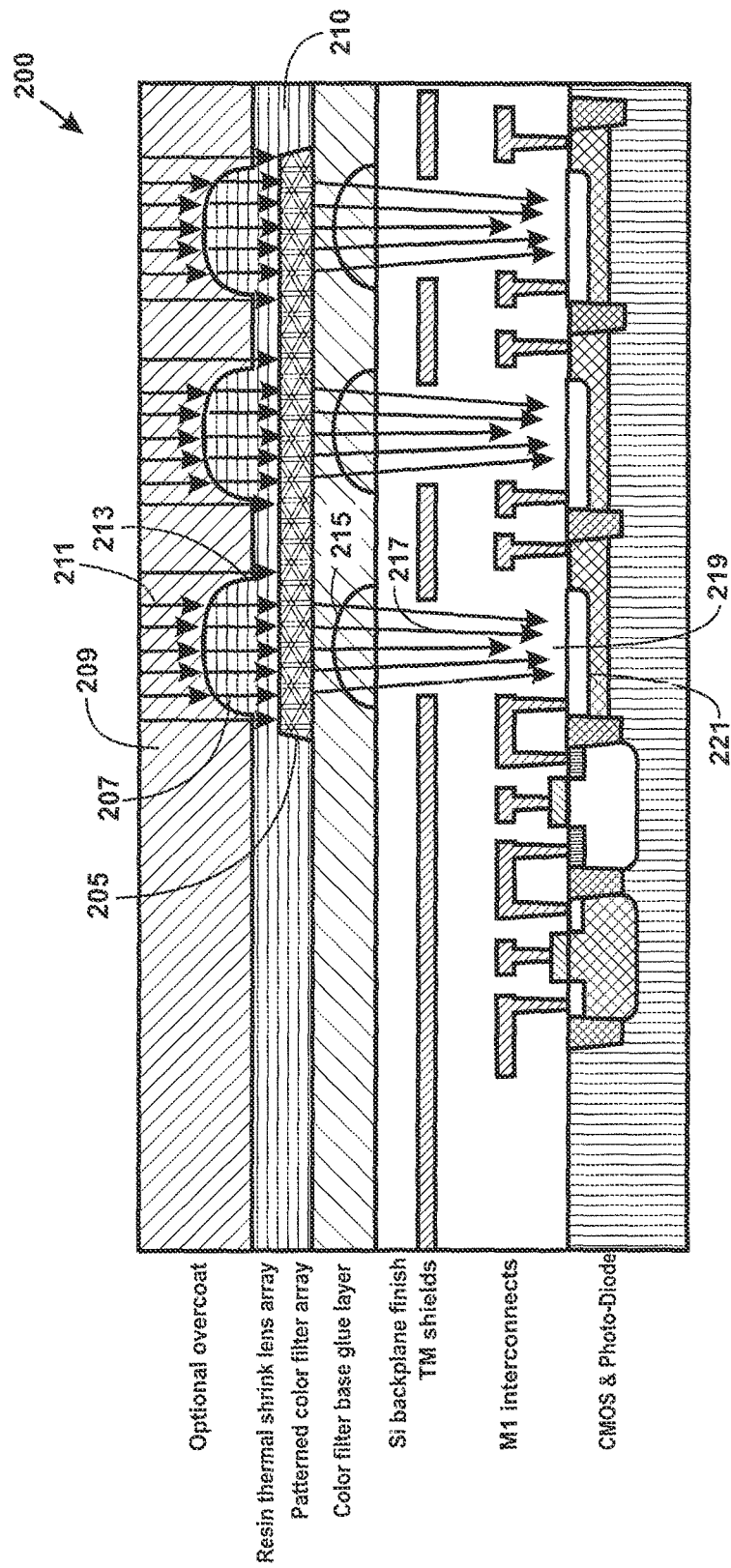
FIG. 2 is a simplified cross-sectional view diagram illustrating an alternative sensing device according to an embodiment of the present invention.

FIG. 2 is a simplified cross-sectional view diagram illustrating an alternative sensing device 200 according to an embodiment of the present invention. This diagram is merely an example, which should not unduly limit the scope of the claims herein. One of ordinary skill in the art would recognize many variations, modifications, and alternatives. As shown, the present invention provides an improved image sensor, e.g., CCD, CID, CMOS. The image sensor includes a substrate, e.g., silicon wafer. The sensor also includes a plurality of photo diode regions, where each of the photo diode regions is spatially disposed on the substrate. Each of the photo diode regions is also separated by an insulating layer or isolation region, as shown. A plurality of MOS and/or CMOS devices are also included. Such devices can be made using standard foundry compatible processes, and the like.

The sensor has an interlayer dielectric layer overlying the plurality of photo diode regions. The interlayer dielectric can be a single layer or multiple layers depending upon the specific embodiment. The layer can be made of a borophososilicate glass, phosophosilicate glass, fluorinated silicate glass, doped glass, or the like. Preferably, the interlayer dielectric layer has been planarized using chemical mechanical planarization and/or resist etch back techniques, among others. Of course, one of ordinary skill in the art would recognize many variations, modifications, and alternatives.

Referring again to FIG. 2, the sensor also has a shielding layer formed overlying the interlayer dielectric layer. The shielding layer can be a metal layer and/or other material that can block a selected portion of electromagnetic radiation, e.g., light. The shielding layer includes a plurality of openings, which allow light to traverse therethrough. Preferably, the shielding layer is made of aluminum material, but can be made of any other single or combination of materials.

A silicon dioxide bearing material is overlying the shielding layer as shown. A plurality of lens structures 215 are formed on the silicon dioxide bearing material. Other types of suitable materials can also be used for the lens structures. That is, any combination of layers or materials can be used with suitable lens characteristics. Each of the lens structures is annular and/or spherical in shape, depending upon the embodiment. Specific details on ways of fabricating the plurality of lens structures can be found throughout the present specification and more particularly below.

A planarizing layer or glue layer is formed overlying the plurality of lens structures. The planarizing layer is preferably made of an organic type material such as polyimide, and the like. The planarizing layer serves as a "glue" layer between the silicon lens structures and overlying color filter layer. The color filter layer has been patterned into an array structure depending upon the embodiment. Preferably, the color filter array includes colors such as red (R), green (G), and blue (B), depending upon the embodiment. As shown, the sensor also has the color filter layer overlying the lens structures.

Overlying the color filter layer is a clear coating layer 210. The clear coating layer can be a polyimide layer or other type of material or materials. A plurality of lens structures 207 are formed in the clear coating layer. Overlying the lens structures is a passivation coating 209. The passivation coating can include any suitable materials such as a clear polymer material and the like. Of course, one of ordinary skill in the art would recognize many variations, modifications, and alternatives.

In operation, light 211 falls onto the surfaces of the passivation layer. The light traverses through 213 lens structure 207 and through 215 color filter array 205, where selected colors pass through selected spatial regions to illuminate a color from the RGB pixel arrays. As shown, the light traverses 217 through the glue layer and through each of the lens structures. Each of the lens structures focuses the light 219, which falls onto photo diode 221, to cause a change in electrical characteristic of the photo diode. The change can be sensed using sensing circuitry, which is coupled to logic circuitry. The shielding layer blocks certain portions of light that are not focused onto the photo diode according to a preferred embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

A method for fabricating a sensing device having an integrated lens structure according to an embodiment of the present invention may be outlined as follows:

1. Provide a substrate, e.g., silicon wafer.
2. Form a plurality of photo diode regions, where each of the photo diode regions is spatially disposed on the substrate, and form a plurality of MOS/CMOS transistors on the substrate;
3. Form an interlayer dielectric layer (e.g., borophosphosilicate glass (BPSG), doped oxide, phosphosilicate glass (PSG), fluorinated silicate glass (FSG)) overlying the plurality of photo diode regions and MOS/CMOS transistors;
4. Form a shielding layer (e.g., metal) formed overlying the interlayer dielectric layer;
5. Pattern the shielding layer;
6. Apply a silicon dioxide bearing material overlying the shielding layer;
7. Planarize the silicon dioxide layer;
8. Etch portions of the silicon dioxide bearing material to form a plurality of first lens structures; and
9. Continue to form each of the plurality of first lens structures to provide a plurality of finished lens structures; and
10. Perform other steps, as desired.

The above sequence of steps provides a method according to an embodiment of the present invention. As shown, the method uses a combination of steps including a way of forming an integrated lens structure for a sensing device according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 3:
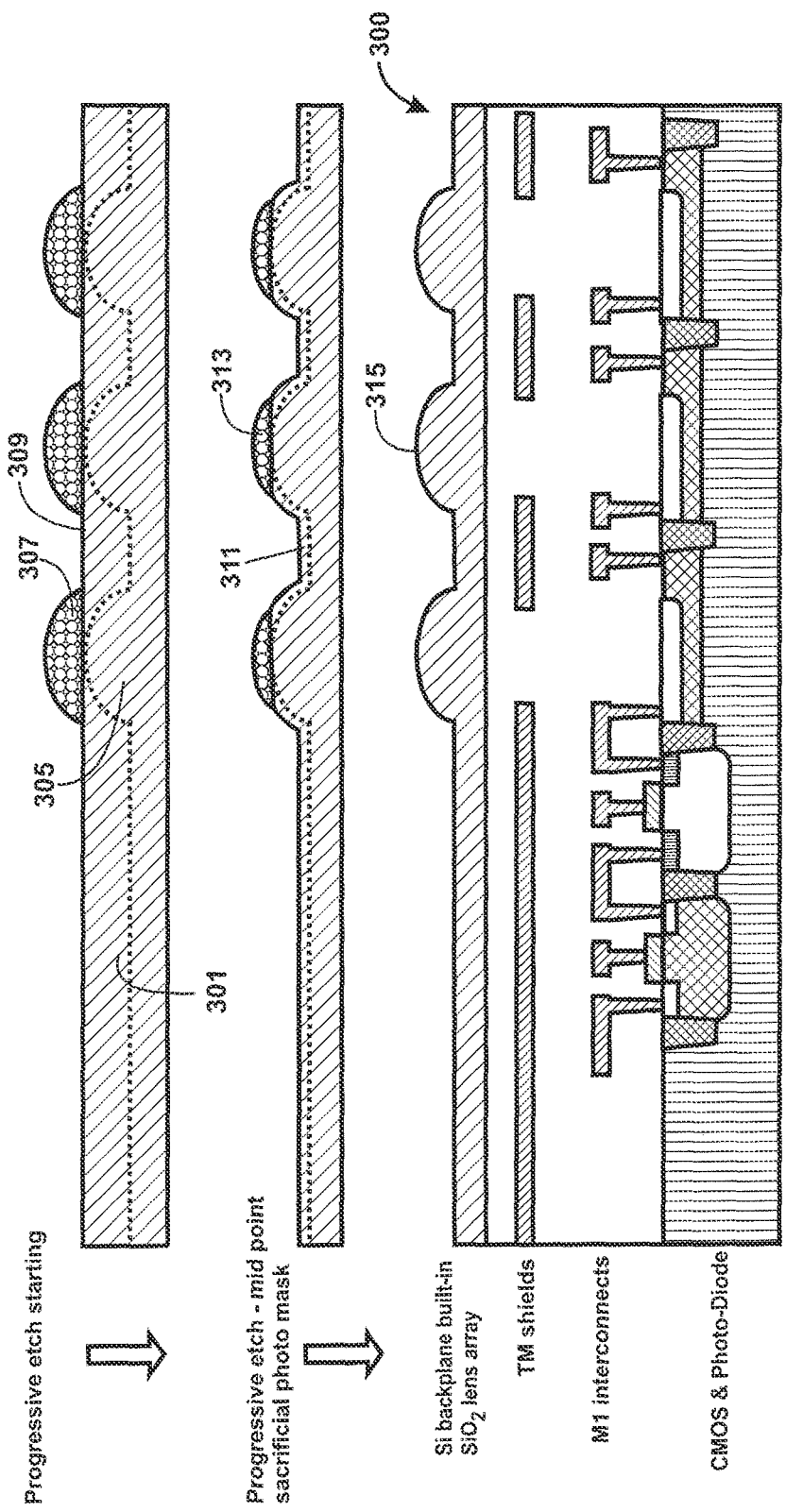
FIG. 3 illustrates a method of fabricating a sensing device according to an embodiment of the present invention.

FIG. 3 illustrates a method of fabricating sensing device 200 according to an embodiment of the present invention. This diagram is merely an example, which should not unduly limit the scope of the claims herein. One of ordinary skill in the art would recognize many variations, modifications, and alternatives. As shown, the method focuses on a way of fabricating the lens structure on a silicon backplane according to a specific embodiment. The method includes providing a silicon dioxide layer 301, which has been deposited. The layer also has suitable characteristics for the present lens structures. The method forms a plurality of photoresist 307 regions overlying selected portions of the silicon dioxide layer. The photoresist regions may be characterized by an annular shape, which can be formed using different exposures, provided on the photoresist regions. The photoresist regions expose region 309, which will be etched. The photoresist region is formed overlying region 305, which will serve as a lens structure, according to a specific embodiment of the present invention.

Using the photoresist as a blocking layer, the method etches the exposed regions 311, as shown. As the method etches the exposed region, portions of the photoresist 313 remain as other portions are removed, to form an annular shaped lens structure 315 having a suitable focal length. Of course, one of ordinary skill in the art would recognize many variations, modifications, and alternatives. The completed structure is illustrated by way of reference numeral 300 in FIG. 3, as shown. The completed structure includes various elements such as substrate, devices, interlayer dielectric layer, metal layers, shielding layer, and lens array. Other elements would also be included to form the finished device according to a specific embodiment. Alternative methods for fabricating the present device can be found throughout the present specification and more particularly below.

Figure 4:
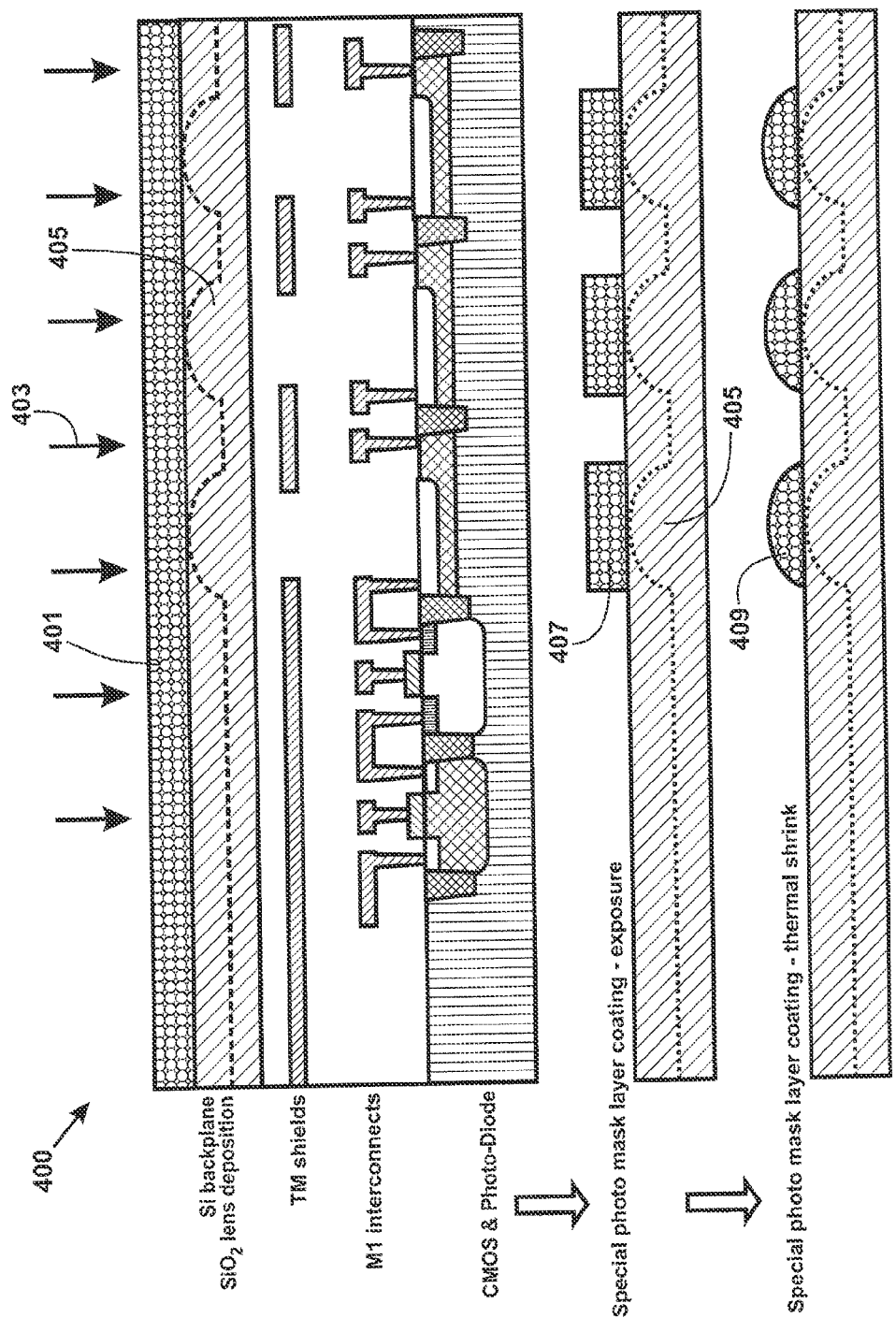
FIG. 4 illustrates an alternative method of fabricating a sensing device according to an embodiment of the present invention.

FIG. 4 illustrates an alternative method of fabricating a sensing device 400 according to an embodiment of the present invention. This diagram is merely an example, which should not unduly limit the scope of the claims herein. One of ordinary skill in the art would recognize many variations, modifications, and alternatives. As shown, the sensing device includes silicon dioxide layer formed on a silicon backplane. The device also includes other elements such as substrate, photodiodes and MOS/CMOS devices, metal interconnects, interlayer dielectric material, shielding layer, among others. The silicon dioxide layer would be used to form a plurality of lens structures 405, as also shown. Preferably, the method includes forming a photo masking layer 401 overlying the silicon dioxide layer. The masking layer is developed 403 and patterned to form a plurality of photo patterns 407. Each of the photo patterns would be used to form lens structure 405 in the silicon dioxide layer. The photo pattern has sharp edges, which are made using the development and patterning process. A thermal treatment is performed on the photo pattern to round the edges of each of the photo patterns. The rounded edges for a plurality of annular photo pattern regions 409 overlying each of the lens structures to be formed. Each of the annular photo pattern regions includes sloped edges that form a resulting thickness of material that is thinner around a periphery of the region and thicker near a center of the region, as shown. Each of the regions exhibit a shape of a fluid material, which is thicker in the center and thinner along the peripheral edges. Of course, one of ordinary skill in the art would recognize many variations, modifications, and alternatives.

Figure 5:
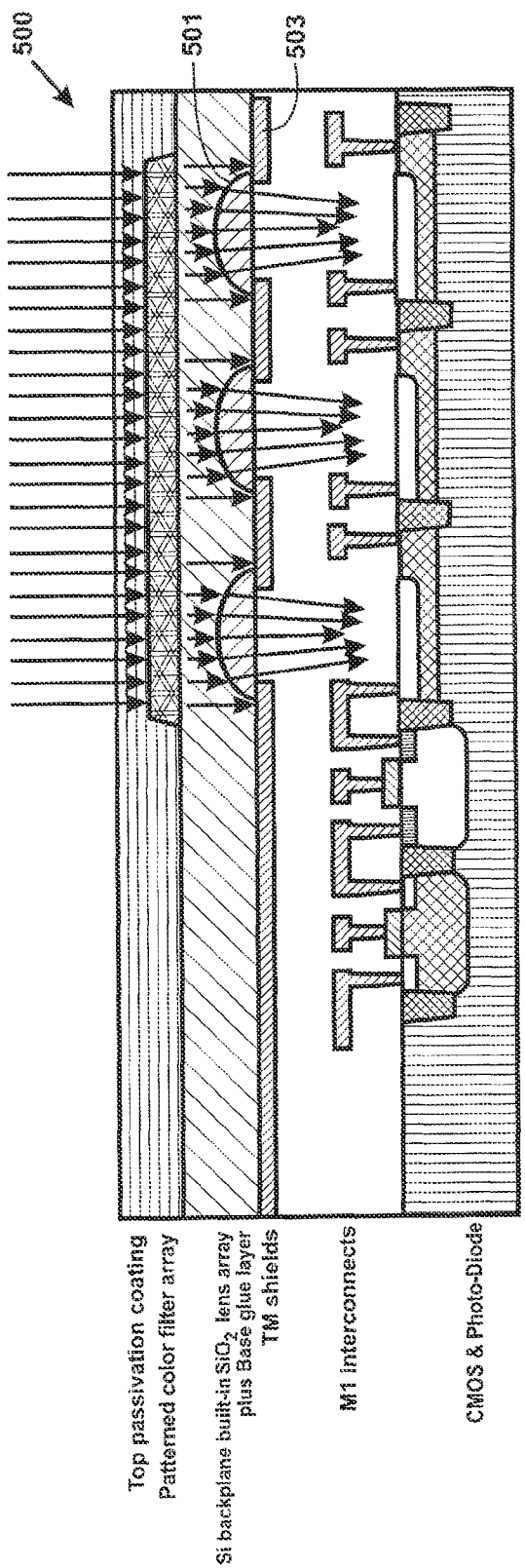
FIG. 5 is a simplified cross-sectional view diagram illustrating yet an alternative sensing device according to an embodiment of the present invention.

FIG. 5 is a simplified cross-sectional view diagram illustrating yet an alternative sensing device 500 according to an embodiment of the present invention. This diagram is merely an example, which should not unduly limit the scope of the claims herein. One of ordinary skill in the art would recognize many variations, modifications, and alternatives. As shown, the device includes common elements as the prior embodiments. Such elements include substrate, photo diodes and CMOS/MOS devices, metal interconnects, interlayer dielectric material, and shielding layer 503.

The device also includes a plurality of lens structures 501, which are formed in a plane within a vicinity of a surface of a shielding layer 503, as shown. Each of the lens structures is made of a suitable material such as silicon dioxide or the like. The device also has an overlying planarization layer, a color filter array, and passivation coating, among other elements. Of course, one of ordinary skill in the art would recognize many variations, modifications, and alternatives.

Figure 6:
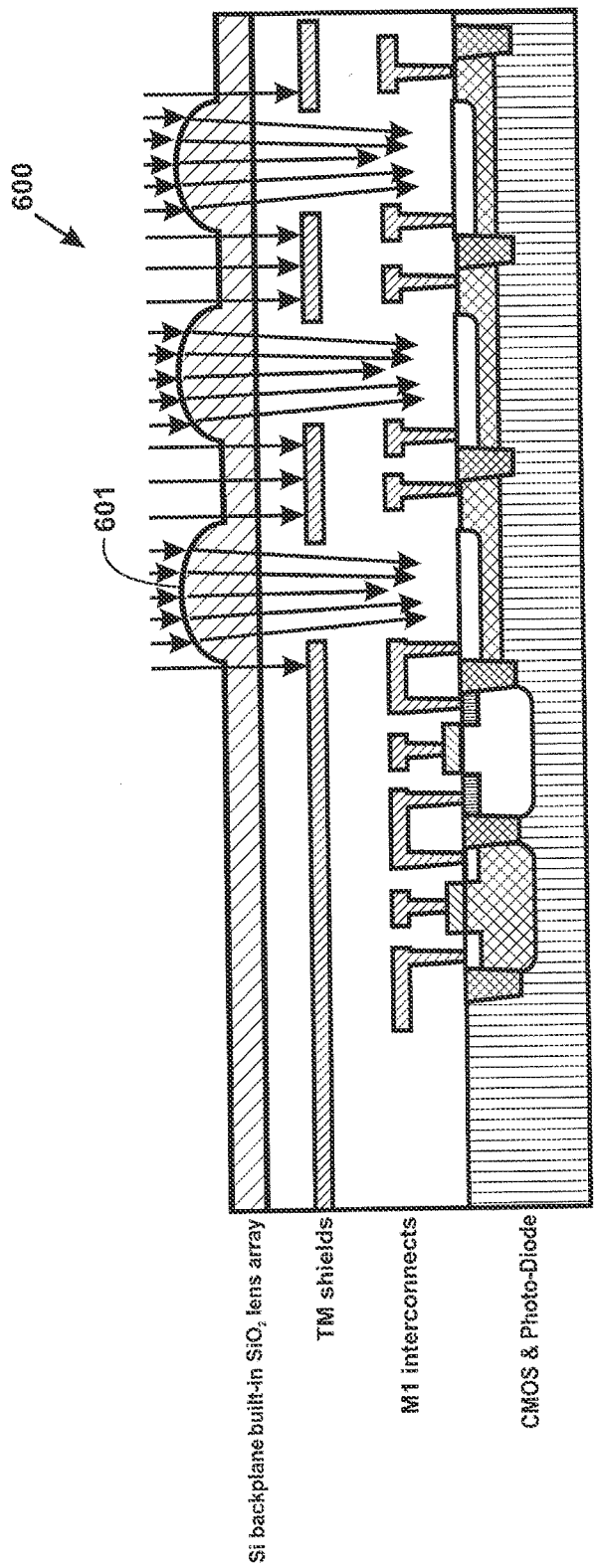
FIG. 6 is a simplified cross-sectional view diagram illustrating still an alternative sensing device according to an embodiment of the present invention.

FIG. 6 is a simplified cross-sectional view diagram illustrating still an alternative sensing device 600 according to an embodiment of the present invention. This diagram is merely an example, which should not unduly limit the scope of the claims herein. One of ordinary skill in the art would recognize many variations, modifications, and alternatives. The sensing device is preferably for a "black and white" integrated circuit sensing chip. As such, the device is free from a color filter assembly or array provided on the device. As shown, the device includes common elements as the prior embodiments. Such elements include substrate, photo diodes and CMOS/MOS devices, metal interconnects, interlayer dielectric material, shielding layer, and silicon dioxide layer.

The device also includes a plurality of lens structures 601, which are formed in the silicon dioxide layer, as shown. Each of the lens structures is made of a suitable material such as silicon dioxide or the like. The device does not have an overlying planarization layer, a color filter array, and passivation coating, among other elements. Of course, one of ordinary skill in the art would recognize many variations, modifications, and alternatives.

A method for fabricating a sensing device having an integrated lens structure according to an embodiment of the present invention may be outlined as follows:

1. Provide a substrate, e.g., silicon wafer.
2. Form a plurality of photo diode regions, where each of the photo diode regions is spatially disposed on the substrate, and form a plurality of MOS/CMOS transistors on the substrate;
3. Form an interlayer dielectric layer (e.g., borophosphosilicate glass (BPSG), doped oxide, phosphosilicate glass (PSG), fluorinated silicate glass (FSG)) overlying the plurality of photo diode regions and MOS/CMOS transistors;
4. Form a shielding layer (e.g., metal) formed overlying the interlayer dielectric layer;
5. Pattern the shielding layer;
6. Apply a silicon dioxide bearing material overlying the shielding layer;
7. Planarize the silicon dioxide layer;
8. Form a patterned mask on the silicon dioxide layer;
9. Etch portions of the silicon dioxide bearing material to form a plurality of first lens structures, each of which is characterized as an island of silicon dioxide bearing material having edges; and
10. Strip patterned mask;
11. Deposit a conformal layer over lens material overlying each of the islands to provide a plurality of finished lens structures; and
12. Perform other steps, as desired.

The above sequence of steps provides a method according to an embodiment of the present invention. As shown, the method uses a combination of steps including a way of forming an integrated lens structure for a sensing device according to an embodiment of the present invention. The integrated lens structures include etching and deposition of materials to form the lens structures according to a preferred embodiment. Other alternatives can also be provided where steps are added, one or more steps are removed, or one or more steps are provided in a different sequence without departing from the scope of the claims herein. Further details of the present method can be found throughout the present specification and more particularly below.

Figure 7:
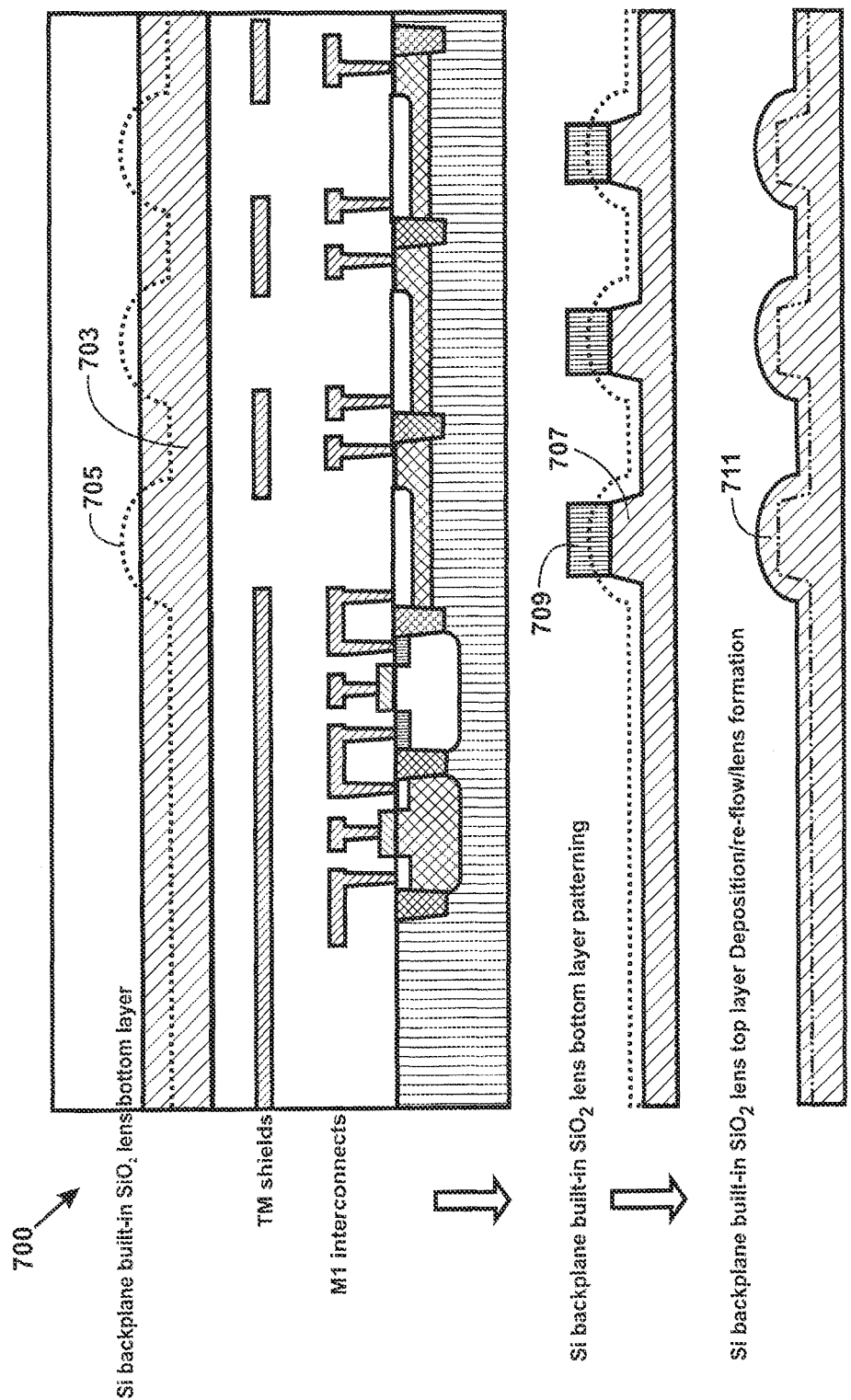
FIG. 7 is a simplified cross-sectional view diagram illustrating still an alternative sensing device according to an embodiment of the present invention.

FIG. 7 is a simplified cross-sectional view diagram illustrating still an alternative sensing device 700 according to an embodiment of the present invention. This diagram is merely an example, which should not unduly limit the scope of the claims herein. One of ordinary skill in the art would recognize many variations, modifications, and alternatives. As shown, the device includes common elements as the prior embodiments. Such elements include substrate, photo diodes and CMOS/MOS devices, metal interconnects, interlayer dielectric material, and shielding layer.

The device also includes a plurality of lens structures 711, which are formed using a combination of etching and deposition, as shown. Each of the lens structures is made of a suitable material such as silicon dioxide or the like. The device may also have an overlying planarization layer, a color filter array, and passivation coating, among other elements. Of course, one of ordinary skill in the art would recognize many variations, modifications, and alternatives.

To manufacture the lens structures, the method includes providing the silicon dioxide or lens material layer 703, which will include the lens structures 705 (see doted line). A patterned masking layer 709 is formed on the surface of the silicon dioxide layer. The silicon dioxide layer is then etched to form islands 707 of lens regions. As shown, the masking layer has vertical edges and is common to conventional photolithography techniques. Depending upon the specific embodiment, plasma etching and/or other etching techniques known in the art can be used. Next, the method deposits 711 a thickness of lens material overlying the islands of silicon dioxide regions. The thickness of lens material is conformal and forms an annular lens structure, as shown. The thickness of material is deposited in a blanket fashion overlying the exposed surfaces, including island structures, to form the annular and/or spherical lens structures. Of course, one of ordinary skill in the art would recognize many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming image sensors, the method comprising:
 providing a substrate;
 forming a plurality of photo diode regions, each of the photo diode regions being spatially disposed on the substrate;
 forming one or more interconnect layers overlying the plurality of photo diode regions;
 forming an interlayer dielectric layer overlying all the interconnect layers;
 forming a shielding layer overlying the interlayer dielectric layer, the shielding layer having openings only above the plurality of photo diode regions to allow light to reach the photo diode regions; and
 forming a plurality of lens structures comprising a silicon dioxide bearing material overlying the shielding layer, wherein the shielding layer comprises openings only underneath the plurality of lens structures and is configured to shield regions not underneath the lens structures.

2. The method of claim 1 further comprising forming a color filter layer overlying the lens structures and forming a plurality of second lens structures overlying the color filter layer.

3. The method of claim 1 further comprising forming a planarizing layer overlying the plurality of lens structures formed on the silicon dioxide material.

4. The method of claim 1 wherein the shielding layer comprises a metal bearing material.

5. The method of claim 1 wherein the plurality of lens structures are formed in the silicon dioxide bearing material using an etching process.

6. The method of claim 1 further comprising forming an organic planarized layer overlying the plurality of lens structures, forming a color filter array overlying the planarized layer, and forming a plurality of second lens structures overlying the color filter array.

7. The method of claim 6 further comprising forming a planarized overcoat layer overlying the plurality of second lens structures.

8. The method of claim 1 wherein the substrate is a silicon wafer.

9. The method of claim 1 further comprising forming a plurality of MOS transistor regions formed on the substrate.

10. The method of claim 1 the etching and continuing comprise forming a patterned mask layer overlying the silicon dioxide bearing material and etching exposed portions of the patterned mask layer.

11. The method of claim 1 wherein each of the plurality of first lens structures provides for focusing onto respective photodiode device region.

12. The method of claim 1 wherein each of the plurality of first lens structures has a refractive index ranging from about 1.44 to about 1.46.

13. The method of claim 1 wherein each of the plurality of first lens structures is characterized by an annular shape.

14. The method of claim 13 wherein the annular shape is spherical.

15. The method of claim 1 wherein the continuing to form comprises depositing a lens material overlying each of the first lens structures to form each of the plurality of finished lens structures.

16. The method of claim 15 wherein each of the finished lens structures is partially finished.

17. A method for forming an image sensor, comprising:
 forming a substrate;
 forming a plurality of photo diode regions, each of the photo diode regions being spatially disposed on the substrate;
 forming one or more interconnect layers overlying the plurality of photo diode regions;
 forming an interlayer dielectric layer overlying the one or more interconnect layers;
 forming a shielding layer overlying the interlayer dielectric layer and the interconnect layers, the shielding layer having openings only above the plurality of photo diode regions to allow light to reach the photo diode regions; and
 forming a plurality of lens structures comprising a silicon dioxide bearing material overlying the shielding layer.

18. A method for forming an image sensor, comprising:
 forming a substrate;
 forming a plurality of photo diode regions, each of the photo diode regions being spatially disposed on the substrate;
 forming one or more interconnect layers overlying the plurality of photo diode regions; an interlayer dielectric layer overlying the one or more interconnect layers and the plurality of photo diode regions;
 forming a shielding layer formed overlying the interlayer dielectric layer and substantially covers the interlayer dielectric layer with openings only overlying the plurality of photo diode regions; and
 forming a plurality of lens structures directly above the shielding layer with no intervening layers.

19. The method of claim 11, further comprising forming at least one of the plurality of lens structures is in direct contact with the shielding layer.

* * * * *